US006923868B2

(12) United States Patent
Grechanyuk et al.

(10) Patent No.: US 6,923,868 B2
(45) Date of Patent: Aug. 2, 2005

(54) INSTALLATION FOR ELECTRON-RAY COATICATION OF COATINGS

(75) Inventors: Mikola Grechanyuk, Kylv (UA); Pavlo Kucherenko, Kylv (UA)

(73) Assignee: GBA S.A., Montreux (CH)

( * ) Notice: Subject to any disclaimer, the term of this patent is extended or adjusted under 35 U.S.C. 154(b) by 0 days.

(21) Appl. No.: 10/744,396

(22) Filed: Dec. 23, 2003

(65) Prior Publication Data

US 2005/0061250 A1 Mar. 24, 2005

(30) Foreign Application Priority Data

Sep. 23, 2003 (CH) .......................................... 01623/03

(51) Int. Cl.$^7$ .............................................. C23C 14/00
(52) U.S. Cl. ............................... 118/719; 118/723 EB; 118/726; 118/730
(58) Field of Search .......................... 118/719, 723 EB, 118/726, 730

(56) References Cited

U.S. PATENT DOCUMENTS

| | | | | |
|---|---|---|---|---|
| 3,656,454 A | * | 4/1972 | Schrader ..................... | 118/724 |
| 4,036,171 A | | 7/1977 | Ramet | |
| 4,122,221 A | | 10/1978 | Scheuermann | |
| 4,192,253 A | | 3/1980 | Aichert et al. | |
| 5,074,246 A | * | 12/1991 | Gailliard et al. ............ | 118/730 |
| 6,083,322 A | * | 7/2000 | Burns et al. ................ | 118/730 |
| 2004/0065262 A1 | * | 4/2004 | Burns et al. ................ | 118/730 |

FOREIGN PATENT DOCUMENTS

| | | |
|---|---|---|
| DE | 28 13 180 | 10/1978 |
| GB | 1 372 167 | 10/1974 |
| JP | 49-21035 | 5/1974 |

OTHER PUBLICATIONS

Webster's third New International Dictionary, Merriam–Webster Inc., Springfield, Mass. 1993, pp. 210, 1719 and 1958.*
Gasik, M. et al. Obtaining functional gradient materials ... European project COST–503. Problems of of Sp. Electrometallurgy, 1996, Issue 1, pp 61–66.
Movchan, B.A. et al. New materials and coatings obtained by electron . . Proceedings of the 2nd intl. conference on electron–beam technologies—EBT–88, 1988, pp. 1005–1023.
Paton, B.E. et al. A way of obtaining composite coatings. USSR certificate of authorship 762,452 from May 16, 1980.
Movchan, B.A. et al. A way of obtaining multilayer coatings. USSR certificate of authorship 91,756 from Jun. 4, 1980.
Movchan, B.A. et al. Gradient heat–protection coatings obtained by electron–beam cooling of vapor phase in vacuum. Pro. of Special Electrometallurgy, 1997, Issue 2, pp. 25–32.
Movchan, B.A. et al. Heat–resistance coatings deposited in vacuum. Kyiv, Naukova Dumka, 1983, p. 230.
Z. Schiller, U. Geising, Z. Panzer. Electron–beam technology. Moscow, Energiya, 1980, 527 pp.

(Continued)

Primary Examiner—Richard Bueker
(74) Attorney, Agent, or Firm—Greenberg Traurig LLP; Eugene C. Rzucidlo

(57) ABSTRACT

This invention relates to an apparatus for electron-ray deposition of a coating on an article. The apparatus comprises a processing chamber with crucibles and electron gun located in the processing chamber and a pre-chamber for loading/unloading cartridges with articles to be coated. The cartridges have a lower fixed conic pinion on a vertical support and are located on a lower cover of a processing chamber. A shaft rotates inside the cartridges which engages an upper running conic pinion of the cartridges.

5 Claims, 3 Drawing Sheets

OTHER PUBLICATIONS

Surface quality Improvement and metal cladding. Ed. A. Knaushner. Moscow, Metallurgiya, 1994, 367 pp.

Equipment for special electrometallurgical processes. A reference and catalog. Ed. A.I. Ivertko (Dr. of Eng.). Kyiv, Naukova Dumka, 1981, pp. 28–30.

Movchan, B.A. et al. Two– and three–layer coatings obtained by deposition in vacuum for protection of gas–turbine blades. Automatic Welding, 1994, Issue 2, pp. 30–38.

Movchan, B.A. et al . . State of the art and prospects of creation . . . Kyiv, Paton Electric Welding Institute, National Academy of Sciences of Ukraine, 1988, pp. 5–12.

Grechanyuk, M.I. et al. A protective coating for gas–turbine blades, application 97,084, 126 from Aug. 6, 1997.

G.V. Samsonov, A.P. Epin. Refractory coatings. Moscow, Metallurgiya, 1973, p. 398.

Thin film technology. Reference. Ed. L. Maissel and R. Glangle. Moscow, Sovetskoye Radio, 1997, p. 662.

Sherbitsky, V.V. et al. Electron–beam unit for obtaining multilayer materials. Problems of Special Electrometallurgy, Issue 16, 1982, pp. 51–53.

* cited by examiner

INSTALLATION FOR ELECTRON-RAY COATICATION OF COATINGS

FIELD OF THE INVENTION

The invention relates to vacuum metallurgy and may be used for coating products having a complex profile.

BACKGROUND OF THE INVENTION

To date the greatest interest from the point of view of creating coatings with defined physical and mechanical characteristics is taken in the so-called functional materials.

It is known that the electron-ray evaporation and subsequent condensation in vacuum of metallic and non-metallic materials is the most accurate method of construction of similar materials at atomic and molecular levels. By changing the precipitation temperature of concentration of phases being introduced and the rotation speed of the products being coated one could easily obtain coatings with introduced phase concentration gradients, microcellular or multi-layer coatings.

It is clear that for deposition of similar coatings in case of parts having a complex configuration, here included the gas turbine blades, suitable electron-ray sets are required. A series of vacuum apparatus designs is available for forming composite coatings.

Deposition of a 3-layer coating is carried out in a multi-chamber vacuum apparatus by moving the substrate from one chamber to another, one layer being precipitated in each of the chambers.

In the working chamber of the vacuum apparatus there are crucibles with evaporating materials which are placed in turns under the substrate which has to be provided with a protective coating.

In the working chamber of the vacuum apparatus the evaporators operate in turns, and the substrate and the mask plate parallel to it can turn and move independently.

The vacuum sets described above have a number of drawbacks:
a). The consecutive applying of just one layer in turn calls forth a lower output of the vacuum apparatus;
b). At the moment of going over to an another crucible there is a change in the evaporation rate of consecutive components which leads to non-uniformity of the structure in respect of its thickness and, as a result of it, to deterioration of physical and mechanical features on the whole;
c). The main drawback of the available technical solutions is the impossibility of coating the product from all sides. With the above-mentioned vacuum apparatus the protective layer is formed only on the part (article of product) side which is turned to the evaporator.

A number of vacuum apparatus are known to be developed for applying multi-component coatings to products with complex profiles (gas turbine blades) from all sides. Yet the design of these apparatus excludes the possibility of their being used for forming gradient and multi-layer coatings.

A detailed review of the electron-ray equipment designs used for coatication of protective coating is given in the prior art literature. The analysis of electron-ray equipment designs reveals the fact that the most universal industrial apparatus for deposition of protective composite coating when products with a complex shape are coated is the UE-175 (УЭ-175) apparatus designed at the NANU Electric Welding Institute named after E. O. Paton, which is comprehensively described in. The apparatus is designed mainly for forming protective anticorrosive coatings at gas turbines blades surfaces by way of electron-ray evaporation. The process of deposition of coating includes ion-plasmous cleaning and heating of blades placed into cartridges in a lock (preparatory) chamber with subsequent precipitation of the protective material evaporated from the crucibles to the surfaces of blades. The heating and evaporation of the material is carried out under the impact of electron rays. The apparatus constitutes a unit of vacuum chambers (the chambers for deposition of coatings and two pre-chambers) with mechanisms, devices and systems ensuring a half-uninterrupted manufacturing method. There are two cylindrical crucibles located in the chambers for deposition of coatings for carrying out evaporation of metal components out of them as well as three rectangular shuttle-type crucibles for evaporating metallic or ceramic components of the coating. The evaporation of the material from each crucible is carried out separately under the impact of electron rays coming from individually controlled electron guns.

Due to the fact that the products (blades) cool down in the process of their being moved from the pre-chamber to the chamber for deposition of coatings, there is one more gun located above the chamber for deposition of coatings which serves for heating up the blades before applying the coating. During the additional heating up the blades are screened from the crucibles (which are set in the evaporation mode) by turning screens. After the blades are heated up to the required temperature (which is monitored by means of pyrometers and thermocouples) the screens are opened and the coating is applied.

Unlike the above-mentioned technological solutions (U.S. Pat. No. 4,122,221 of Oct. 24, 1978; FRG Pat. No. 2813180 of Oct. 4, 1979), the apparatus allows to form not only multi-component coatings of the MeCrAlY-type, where Me-Co, Ni, Fe, but also composite coatings of the MeCrAlY-Me-O, Me-C-type.

In the process of operation of these apparatus at enterprises in Russia (NVO "Trud", Samara; Litkarinsk Machine-Building Works, Moscow Region), Ukraine (SPB "Mashproyekt", Mykolayiv; Southern Turbine Works "Zorya", Mykolayiv), a number of design drawbacks have been detected. Preliminary heating of the blades in the pre-chambers proved to be improper. In consequence of permanent loading/unloading there is condensate accumulating from the air in the pre-chambers which thereafter causes formation of oxide films on the surfaces of the blades when they are heated. When thereafter the protective layer is applied, the presence of such a separating layer inevitably leads to peeling off of the coating in the process of operation of the blades.

In the process of evaporation of oxide, carbide or boride compositions from the "shuttle"-type crucible there are craters forming on the surface of the materials being evaporated which inevitably leads to changes in the speed of evaporation of these compositions and, as a result, the composite coatings of the MeCrAlY-Me-O, Me-C, Me-B type have a non-uniform chemical composition throughout the thickness and are not serviceable.

Therefore, a number of important modifications have been made to the design of the UE-175 apparatus, and the more recent versions of the apparatus (UE-187, UE-187 M apparatus) are provided with a crucible device which consists of 4 cylindrical crucibles arranged in a row. This type of the crucible device allows to ensure continuous feeding of the material being used to the evaporation area. Bars or up to 800 mm long billets of ceramics can be loaded to the crucibles. All guns are provided with electron ray scanning programmers. So, by choosing the appropriate scanning programme, one can ensure uniform evaporation of the components which are sublimated during electron ray heating without formation of any craters. The apparatus of this type are provided with automated technological process control systems. Therefore by choosing appropriate programs one can easily obtain composite disperse-reinforced or micro-layer coatings of corresponding MeCrAlY–MeO, MeC, MeB or MeCrAlY/MeCrAlY+MeO, MeC, MeB types; coatings with phase gradient along the thickness. The technology of applying such coatings is described in detail in. The industrial apparatus of the UE-187 M type designed at the NANU Electric Welding Institute named after E. O. Paton for coatication of two-layer and multi-layer heat-insulating coatings are used by US and German firms, in particular by the American firm "Pratt and Whitney".

Nevertheless, despite wide potentialities offered by this equipment, the American firm "Pratt and Whitney" uses now a combined method of applying heat-reflecting coatings. The inner metal Ni(Co)CrAlYHfSi-layer is applied by plasma spraying, whereas the outer ceramic layer is applied by electron-ray deposition.

Such a technical solution is caused by the impossibility of introduction of a required amount of itrium, hafnium, silicon, zirconium into the inner metal layer by evaporation from one source.

In general, the crucible device with linear arrangement of the four cylindrical crucibles may be used for obtaining metal MeCrAlY coatings alloyed additionally with zirconium, hafnium or silicon. It can be achieved by means of independent evaporation of MeCrAlY-type alloys and refractory metals from autonomous sources (crucibles). Yet in case of a linear arrangement of the crucibles it is difficult to ensure a uniform distribution of components in the coating along the blade when, for example, the following technological scheme of evaporation is implemented: the MeCrAlY alloy—evaporation from the central crucible; alloying addition, hafnium—from the crucibles adjacent to the central crucible on its left and right. When simultaneous introduction of one more addition, for example, silicon, to the coating is required, the use of such a technological scheme becomes impossible at all as during evaporation of three different materials from three independent crucibles any chemical uniformity of the chemical composition is out of the question.

When the said technological scheme is used, it is impossible to precipitate two-layer heat-reflecting coatings of the MeCrAlYHfSi/MeO type during one single technological cycle as it would require to load preliminarily at least three crucibles with the components of the metal layer of the coating, and only after that use the same crucibles for precipitating the ceramic layer. So it has been proposed in to implement a new crucible device design with respect to the UE-175, UE-187 apparatus that are produced serially, which would allow to eliminate all the drawbacks described above. The crucible device is provided additionally with "shuttle"-type crucibles which are made in the form of semi-rings ensuring the maximum closeness to the central crucible. The said design of the crucible device allows to precipitate the MeCrAlY alloy from the central crucible, the Y, Hf, Si, Zr alloying additions from the "shuttle"-type crucibles, and the ceramic component from the other three cylindrical crucibles. In this case the Y, Hf, Si, Zr alloying components are placed in the crucibles in form of separate tablets (bricks, bars) geometrically with precise definition of their location along the perimeter of the crucibles. The mass of the Y, Hf, Si, Zr tablets (bars) and their geometrical allocation in the crucibles are defined so as to obtain the required concentration of the said elements in the MeCrAlYHfSiZr layer, and they depend also on the dimensions of the parts being coated.

The electron-ray gun which is used for evaporating the Y, Hf, Si, Zr alloying components is provided with a special electronic unit which allows to change under a given program the density of the electron ray depending on the perimeter of the surface of the crucibles which are loaded with the tablets (bars) of the Y, Hf, Si, Zr alloying components. So, by changing the density of the electron ray, the geometrical dimensions of the alloying components billets (bars) and their allocation in the crucibles, one can obtain the required concentration of the alloying additions in the coating throughout the perimeter of the products being provided with the protective coating.

Due to doping the MeCrAlY Y, Hf, Si, Zr matrix alloys and presence of disperse oxide additions in the composite micro-layers, the diffusion processes at the inter-layer boundaries become more complicated. Formation of layers on the basis of complex spinels of the $2Y_2O_3*Al_2O_3$, $3Al_2O_3*2SiO_2$ type occurs in the process 2–2.5 times slower than it would take place under the same testing conditions in case of two-layer MeCrAlY/MeO coatings.

Industrial electron-ray apparatus of the UE-175, UE-187 type that are provided with such crucible devices ensure obtaining of practically the whole line of protective coatings, from the simplest one-layer coatings of the MeCrAlY type to two-layer MeCrAlYHfSiZr/Me type and three-layer MeCrAlYHfSiZr/MeCrAlYHfSiZr+MeO/$ZrO_2$—$Y_2O_3$ type coatings, where MeO is the aluminium oxide or itrium oxide stabilized zirconium dioxide. In this case the composite MeCrAlYHfSiZr+MeO layer may be made in the form of alternating metal MeCrAlYHfSiZr and composite MeCrAlYHfSiZr+MeO layers, the thickness of the mono-micro-layer being from 0.5 to 1.2 µm. It is possible also to obtain coatings with components and compositions concentration gradient and so on.

It seems that the next revolutionary step in the creation of a new generation of gas turbine apparatus will be the development of blades made of materials on the basis of refractory metals and alloys that do not require cooling. Today, obtaining of alloys on the basis of refractory metals with high level of mechanical characteristics does not pose any problems. The main problem in respect of their use in the gas turbines manufacturing industry is the problem of effective protection of the alloys from catastrophic oxidation in the process of their operation over a long period of time (hundreds and thousands of hours). Diffusive silicide coatings, especially when modified with alloying elements such as boron, aluminium, titanium, chrome and others, are one of the main types of coatings used for protection of the refractory metals and their alloys from high-temperature oxidation. According to the data given in the prior art literature there are more than 100 industrial firms and research centers in USA that develop high-temperature protective coatings, almost half of which engages in creating heatproof coatings for refractory metals. At the same time it is mentioned that for operation at high temperatures (up to 1573-2003K) the most promising is deemed to be the use of intermetallides, and first of all silicides. Yet the research works carried out during the last three decades did not result in creating reliable silicide coatings, which could effectively protect products made of refractory metals and alloys over long periods of time under extreme conditions of operation.

The main methods of obtaining silicide coatings and the industrial equipment required for that are described in detail in the prior art literature; the following main methods of obtaining silicide coatings might be singled out:
1). Saturation from steam and gas mixtures containing silicon compounds, mostly haloid ones, with hydrogen or without it (gas-phase siliconizing);
2). Saturation in silicon vapour in vacuum (vacuum siliconizing);
3). Saturation from rare phase by electrolysis or without it (rare phase siliconizing);
4). Saturation in powder siliconeous mixtures with activators (gas-phase siliconizing in powder)

It is pointed out that, as a rule, the vacuum silicide coatings have better technical characteristics compared to other methods. As a rule, the vacuum siliconizing is carried out from backfilling of high-clean silicon powder; furthermore, it can be carried out under conditions when the metal which is being saturated and the silicon are separated one from another and may be heated up to different temperatures. However, the vacuum siliconizing is a lengthy and costly process and is not notable for high output; there are also substantial limitations in respect of the overall dimensions and form of the parts.

There is one of the most important features out of the large variety of characteristics of the silicide coatings, due to which these coatings are mainly being developed, that needs to be examined, and it is the heat resistance. As the disilicides of the metals belonging to the sub-groups IV and VI have the highest heat resistance, it's exactly these phases that are usually used in coatings. Their behavior in the open air or in oxygen (at different pressures) in a large range of temperatures is rather well known. According to the data given in the prior art literature, the disilicides of the sub-groups IV and VI might be graded in the following order in respect of their resistance to open air oxidation: $TiSi_2$, $ZrSi_2$, $NbSi_2$—resistant up to temperatures 1073–1373° K.; $TaSi_2$—up to 1373–1673° K.; $CrSi_2$, $WSi_2$—up to 1673–1973° K.; $MoSi_2$—up to 1973–2073° K.

Creation of coatings on the basis of complex silicide compositions doped additionally with boron, titanium and other elements is of extraordinary interest.

The operational reliability of the products having silicide coatings can be further increased by means of creating combined two-layer coatings of the silicide/oxide type ($MeSi_2$/MeO).

However, the traditional methods of applying silicide coatings do not allow to obtain such combined two-layer or multi-layer coatings.

Electron-ray evaporation of metal and non-metal materials with their subsequent condensation in vacuum gives some chances in respect of obtaining such coatings.

However, the electron-ray apparatus designs considered above do not allow to carry out industrial precipitation of silicide coatings on parts by the following reasons.

As is well known, Si, Ti, Zr, Nb, W, Cr differ substantially in respect of vapor resiliency. So evaporation of compositions of the $MeSi_2$ type from one source (crucible) is not possible.

In case of industrial electron-ray apparatus with multi-crucible evaporation and linear arrangement of crucibles there is a principal possibility of synthesizing similar compositions in vapor phase. Yet in this case there is substantial non-uniformity of the chemical composition of the silicide coating along the length of the product being coated, as for example in case of evaporation of Ti and Si from two linearly arranged crucibles. Precipitation of more complex silicide coatings from four linearly arranged crucibles is hardly imaginable at all.

Silicide coatings may be synthesized in electron-ray apparatus with multi-crucible evaporation where the crucibles are arranged in circle. One design of such an apparatus is described in the prior art literature.

The source materials in the form of bars or burnt billets were located in four copper water-cooled crucibles, 70 mm in diameter, which were arranged in circle. The bars or billets were placed on copper water-cooled rods connected with vertical feed mechanisms for replenishment of the material evaporated from the bath. Separated or mixed vapor flows were being precipitated on a revolving substrate made of 8-mm thick stainless steel in the form of a disk having 520 mm in diameter. The substrate speed was regulated in the range of 0.05 to 200 rpm.

During the technological cycle the prescribed substrate speed is maintained strictly constant with the help of a-single-phase thyristor unit ETO 1. Six electron-ray heaters with the capacity of 60 kW each are intended for evaporating the source materials and heating the substrate.

The apparatus is provided with control units for electron-ray heaters. The automatics system used provides for maintaining and regulating the necessary rate of evaporation of each component during the whole technological cycle and allows to carry out evaporation of materials in pulsed mode.

With the said apparatus one- or two-layer silicide coatings can be easily synthesized by changing the location of 4 crucibles arranged in circle, evaporating for example Ti and Si from two adjacent crucibles and Zr and Si from the two other crucibles. Using this technological scheme one could also easily form two-layer coatings of the $MeSi_2$/MeO type. Yet the said apparatus allows to precipitate coatings only from one side of the product. Furthermore, it has a very low output as after applying the coating time is required for cooling the products down and loading the main processing chamber with the new group of products to be coated. In consequence of continual opening of the main processing chamber, condensate is being formed from the air at the chamber walls. When the products are heated, the moisture from the chamber walls is being condensed at their surface forming oxide films and this leads to pealing off of the coating applied, and this is inadmissible.

The apparatus that is the nearest to the apparatus claimed in respect of the technological main points is the one described in the Japan Patent No 54-18989 of Oct. 4, 1977, the scheme of which is shown in FIG. 1.

The apparatus is intended for applying coatings on products in form of fingers (rods) and has a number of drawbacks in respect of its use for precipitation of coatings on gas turbine blades:

a). Under such a scheme it is impossible to carry out locking of products as they are loaded when the working chamber is open, which has a negative impact on the adhesion feature of the layer sprayed onto the substrate.

b). The design of the cartridge with the products is so that the turning of each of the rods (13) with products stringed on it is transmitted through wheels (8a) rolling along the encircling ring (9) located externally relative to products (along the internal perimeter of the chamber), which is more complicated from the design point of view than providing the drive at the center.

c). When such a scheme is used, the problem of protecting the wheels (8a) and the encircling ring (9) from steam flow getting into them arises. Accumulation of condensate on the said parts brings about braking and, in some cases, even wheel spin when the wheels are rolling along the encircling ring (9). On the other hand, deformation of the П-form structure of the ring (9) is possible when it is overheated, which automatically excludes any uniform revolving of the products on their axis indispensable for obtaining uniform thickness coatings along the perimeter of the products being provided with protective coating.

d). As each cartridge rod has a certain diameter size in the cross-section perpendicular to the axis of the rod, the number of the rods in the cartridge is defined by the following relationship: the more rods are located around the cartridge, the larger the space around the vertical axis of the chamber not occupied by the products (see the hatched areas in FIG. 2 a,b,c).

In this case the most of the vapor obtained in the process of evaporating the alloy from the central crucible (see FIG. 1) is not used for forming the coating (does not get onto the surface being coated).

SUMMARY OF THE INVENTION

The object of the present invention is creation of a new generation of electron-ray equipment which would allow to precipitate practically all types of protective coatings used at present, as well as fundamentally new metal, ceramic, cermet, silicide coatings of the gradient and micro-layer types. This object is achieved by the following: the apparatus for applying the coatings consists of a processing chamber, with crucibles and electron-ray guns located within the processing chamber, and a pre-chamber for loading/unloading the cartridges with the articles or products to be coated, and wherein a lower fixed conic pinion of the cartridge with the articles or products to be coated is installed on the vertical support located on the lower cover of the processing chamber, with a shaft rotating inside the cartridge which engages an upper running conic pinion of the cartridge.

DETAILED DESCRIPTION OF THE INVENTION

Figure 1:
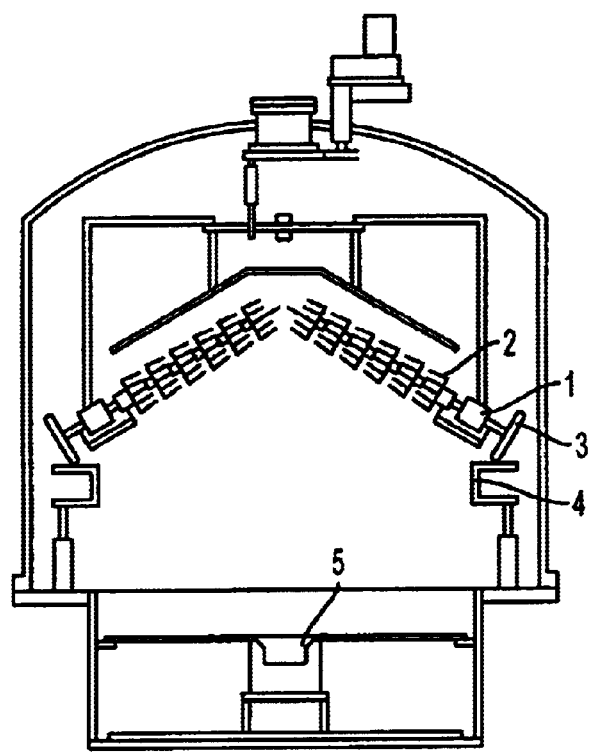
FIG. 1 shows the apparatus diagram according to the Japan Patent No 54-18989 of Oct. 4, 1977 which serves as a prototype for the claimed electron-ray apparatus.
Figure 2:
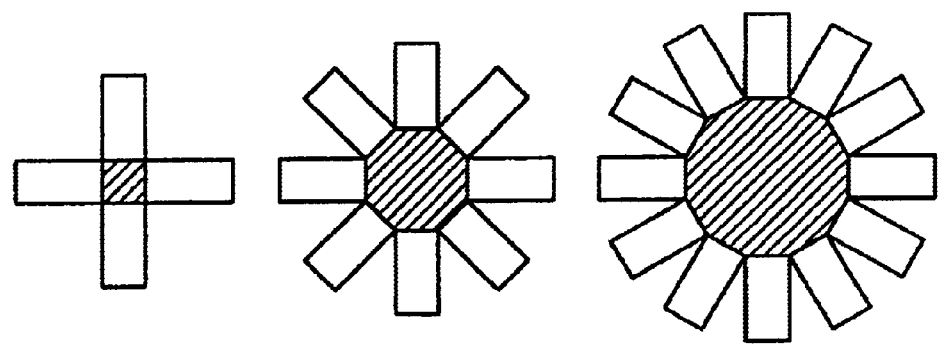
FIG. 2 shows the relationship of the area not used for precipitating the condensate in case of using one central crucible at the apparatus shown in FIG. 1.
Figure 3:
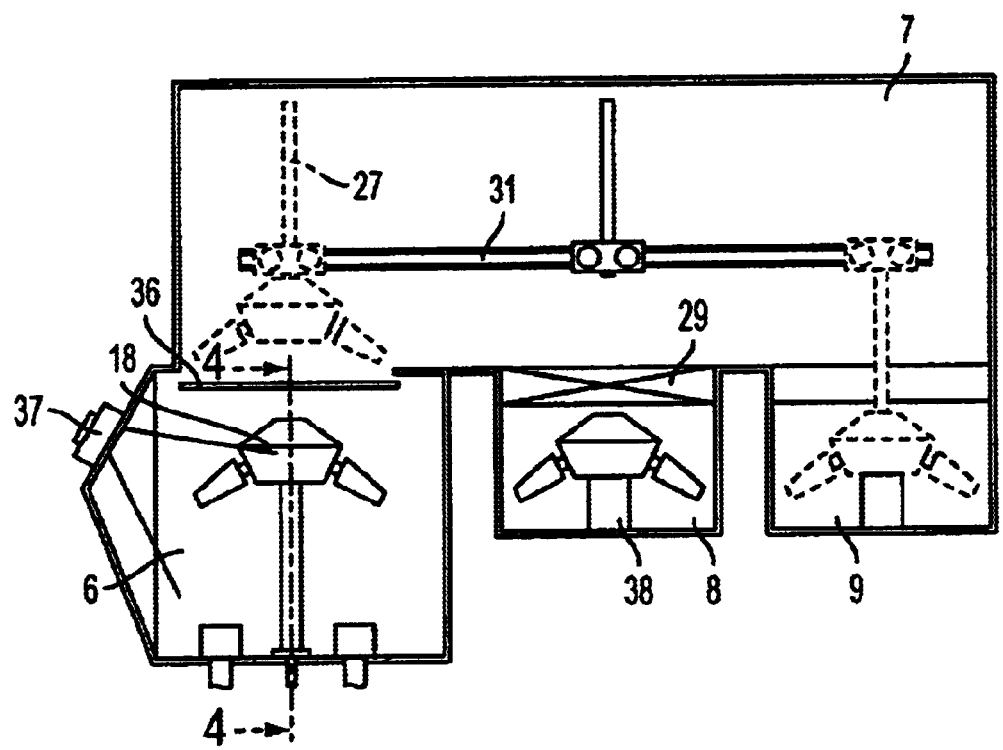
FIG. 3 shows the longitudinal section of the claimed present apparatus.
Figure 4:
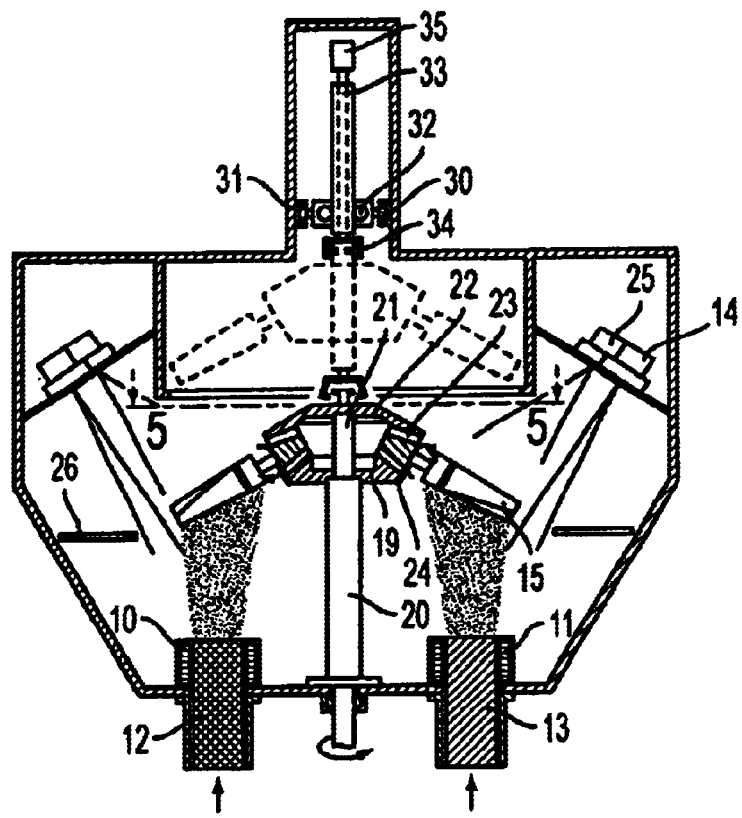
FIG. 4 shows the layout diagram of the main units of the processing chamber.

The apparatus is shown in the FIG. 3 (longitudinal section) and FIG. 4 (cross-section and the top view of the cartridge with the products).

The apparatus (FIG. 3) is a vacuum set comprising four interconnected vacuum chambers, namely the main processing chamber (6), the transfer chamber (7), and two lock chambers (pre-chambers) (8) and (9). At the center of the processing chamber (6) there are water-cooled crucibles (10, 11) containing the bars (12, 13) of the materials being evaporated.

The rays coming from the electron-ray guns evaporate the material of the bars, the vapor of which is condensed on the products (15). The number of the crucibles being used may vary depending on the desired chemical composition and the structure of the protective coating (two-layer, three-layer, micro-layer) (crucibles 16, 17).

The lower conic pinion (19) of the cartridge (18) with the articles or products to be coated is installed on the vertical support (20) with the shaft (21) rotating inside it which engages the upper conic pinion (22) of the cartridge. The conic pinions (23) with the articles or products fixed on them are inserted between the running and fixed conic pinions. The conic pinions (23) are kept from falling out by the retaining ring (24).

Thus, during rotation of the pinion (22) the conic pinions (23) roll about the lower conic pinion (19) turning simultaneously on their own longitudinal axis. In this way the products or articles being coated pass alternatively above the crucibles containing the materials being evaporated, and as a result a protective coating layer is formed on the surfaces of the products.

As mentioned above, depending on the structure of the coating and its operational characteristics the geometry of the crucibles layout and their number may vary.

Figure 5:
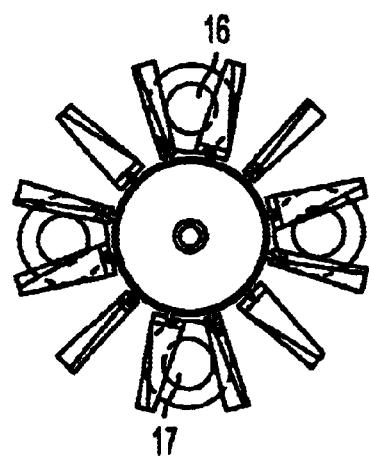
FIG. 5 shows the layout of the crucibles with the materials being evaporated relative to the products being coated.

For example, in case of operation of the apparatus with the crucibles arranged as shown in FIG. 5, the percentage content of each of the evaporated heterogeneous materials will gradually increase as the cartridge with the products comes nearer to the vertical axis of the crucible from which the corresponding material is being evaporated, and accordingly decrease when the cartridge moves away from the crucible. So forming a smooth concentration boundary between heterogeneous materials becomes an easy task, which is indispensable, for example, in case of evaporating ceramics and metals—materials that have substantially different coefficients of thermal linear expansion.

Finally, it is possible to easily obtain by evaporation micro-layer coatings without transition concentration boundaries between the alternating layers in case of vertical screens placed between the crucibles reaching the lower end of the products.

There are cartridges of individual design made for each specific type of products taking into account the overall horizontal dimensions of the product, which is often required when coatings are precipitated on gas turbine blades. For preliminary heating of the products before precipitation of coatings electron-ray guns (25) are used. During-heating of the products up to the specified temperature they are screened by the movable screens (26) to prevent any deposition of condensate on the insufficiently heated products when the working process of spraying is being established, which would bring about insufficient adhesion of the coating to the surface of the product.

After the specified temperature of the products is reached and the working regime of evaporation of metals and non-metals from crucibles (10, 11, 16, 17) has been established, the screens (26) are opened and coatings are precipitated on the products under defined programs using an automated technological process control system (ATPCS).

Upon completion of precipitation of the coating the cartridge with the products is lifted up by the manipulator (27), transferred to one of the lock chambers (for example, to the chamber 8) onto the support 28, where the products cool down. Before taking out the cartridge with the coated products the lock shutter (29) is closed and air is let in the lock chamber.

At the same time with the process of deposition of coatings in the processing chamber (6) and subsequent cooling down of the coated products in the pre-chamber (8) another cartridge containing products prepared for coating is placed into the pre-chamber (9). The required vacuum degree is reached in the pre-chamber (9), then the lock shutter is opened, the cartridge with the products is transferred to the processing chamber and the process of applying a coating is repeated.

The manipulator (27) for moving the cartridges with the products is a carriage (30) moving along the guides (31) located in the transfer chamber (7). There is a rod (33) on the carriage moving by means of the drive (32); inside the rod there is a seizing rod (34) the jaws of which are controlled by an electromagnet 35 (or any other drive). The carriage moving drive (30) and the rod lifting/lowering drive (38) are of electromechanical type, the motors are located immediately on the carriage. This excludes the need of introducing rods for moving the cartridges with the products into the vacuum chamber. On the one hand, this makes unnecessary making costly rods with vacuum sealing, and on the other hand, there is no need for checking the state of the vacuum inputs during each shift for preventing air getting into the processing chamber.

There is a moving screen (36) used for prevention of the condensate getting into the transfer chamber during the process of precipitation of coatings.

The process of precipitation of coatings is controlled by means of a stroboscopic supervision system (37) installed at the front door of the processing chamber.

The design of the claimed industrial electron-ray apparatus in fundamentally new. It is simpler than existing technical solutions and at the same time universal. With the said apparatus it is possible to precipitate all types of protective coatings used today as well as new types of coatings mentioned above.

Let us illustrate the possibilities of the apparatus:
1) precipitation of one-layer coatings of the MeCrAlY type on the turbine blades. There are NaCrAlY alloy bars placed into the crucibles (10, 11) of the working chamber. Cartridges with the products to be processed are being loaded to the pre-chambers (8, 9). The apparatus gets sealed and vacuumed. When the required degree of vacuum is reached, the cartridge (18) with the products is transferred to the working chamber (6). The products (15) are heated up to the specified temperature by means of electron-ray guns (25) with the screens (26) being in shut position, and the specified regime of evaporation of bars (12, 13) is established by means of electron-ray guns (14). After the specified regime of evaporation and heating of the products is established, the screens (26) are opened and applying of coatings on the products is carried out.
2) precipitation of a one-layer coating of the MeCrAlYHfSi type on gas turbine blades. CoCrAlY alloy bars are placed into the crucibles (10, 11) of the working chamber (6) and correspondingly hafnium and silicon bars—into the crucibles (16, 17). The cartridges with the products to be coated are loaded to the pre-chambers (8, 9). The apparatus gets sealed and vacuumed. When the required degree of vacuum is reached, the cartridge (18) with the products is transferred to the working chamber (6). The products (15) are heated to the specified temperature by means of electron-ray guns (25) with the screens (26) being in shut position, and the specified regime of evaporation of bars located in the crucibles (11, 12, 13, 14) is established. After the specified regime of evaporation and heating of the products is established, the screens (26) are opened and applying of coatings on the products is carried out.
3) precipitation of a two-layer coating of the MeCrAlY/$ZrO_2$—$Y_2O_3$ type on gas turbine blades. CoCrAlY or MeCrAlY alloy bars are placed into the crucibles (11, 12) of the working chamber (6), and $ZrO_2$—6–8 mass % $Y_2O_3$ ceramics billets—into the crucibles (16, 17). The cartridges with the products are loaded to the pre-chambers (8, 9). The apparatus gets sealed and vacuumed. When the required degree of vacuum is reached, the cartridge (18) with the products is transferred to the working chamber (6). The articles or products (15) are heated to the specified temperature by means of electron-ray guns (25) with the screens (26) being in shut position, and the specified regime of evaporation of bars and billets located in the crucibles (11, 12, 16 and 17) is established. After the specified regime of evaporation and heating of the products is established, the guns evaporating the ceramics from the crucibles (16,17) are turned off and screens (26) are opened. The inner metal MeCrAlY layer is applied. Upon completion of applying the inner heat-resistant metal layer the guns evaporating the MeCrAlY alloy are turned off and the guns evaporating ceramics are turned on. In so doing, the outer ceramic $ZrO_2$—$Y_2O_3$ coating is formed. The MeCrAlY/$ZrO_2$—$Y_2O_3$ two-layer coating is precipitated in the process of one technological cycle. In case of need a specified smooth transition concentration boundary between the metal and ceramic components of the two-layer coating can be easily obtained.
4) precipitation of a silicide coating of the MeCrAlY/$ZrO_2$—$Y_2O_3$ type on gas turbine blades. Chrome, silicon and molibden bars are placed by turns into the crucibles (11. 12, 16. 17). After sealing and vacuuming of the apparatus and establishing the specified regime of evaporation and heating of the products to be coated the screens (26) are opened and the silicide coating with complex chemical composition is being precipitated. It is clear that the chemical composition of the coating may be easily regulated by changing the evaporation rate of Cr, Mo and Si.
5) precipitation of a $CrSi_2$/$MoSi_2$ micro-layer coating on gas turbine blades.

The process of precipitating micro-layer coatings differs from the process described in example 4 by that it is carried out by turns, with specified intervals of turning on the electron-ray guns that evaporate the Cr, Si and Mo, Si bars correspondingly. Depending on the time intervals and the rate of evaporation of the components coatings with alternating chrome silicide/molibden silicide layers might be formed with given thickness and chemical composition.

The list of examples illustrating the possibilities in respect of precipitation of coatings offered by the new electron-ray equipment might be continued. However, in our opinion, the examples listed above are convincing evidence for undoubted advantages of the new design of an industrial electron-ray apparatus compared to the apparatus that are used now.

What is claimed:
1. An apparatus for electron beam deposition of a coating onto a article, comprising an evacuatable process chamber with crucibles and an electron gun located in the process chamber for vaporizing coating material in said crucible to cause a flux of vapor to be emitted from the crucibles;
    a cartridge for holding the article while it is transported into and out of the processing chamber and while the article is coated, wherein the cartridge comprises upper and lower conic members and a pinion rotatably held between the upper and lower conic members with an article support means connected to the pinion;

a fixed vertical support in the process chamber for supporting the lower conic member in a stationary position;

a rotating shaft in said process chamber adapted to be connected to and rotate the upper conic member; a load-lock chamber connected to the process chamber by an opening;

wherein said apparatus is adapted to operate in a manner such that the cartridge, including the upper and lower conic members and pinion, is moved from the load-lock chamber into the process chamber and positioned on the fixed vertical support such that the lower conic member is held stationary while said rotating shaft extends inside the cartridge and causes the upper conic member to rotate, whereby the pinion is caused to rotate between the stationary lower conic member and the rotating upper conic member, and whereby an article held by the article support means of the pinion is caused to be rotated about two different rotational axes simultaneously and to be transported along a path that causes the article to pass through said flux of vapor.

2. The apparatus of claim 1 wherein plural pinions with articles fixed thereon roll along the lower fixed conic member, revolving simultaneously on their longitudinal axes.

3. The apparatus of claim 1 further comprising a transfer chamber adapted for transporting the cartridge with the article from the process chamber to a pre-chamber where the cartridge is unloaded.

4. The apparatus of claim 3 further comprising a manipulator located in the transfer chamber for placing and removing the cartridge and transporting it to the pre-chamber.

5. The apparatus of claim 4 wherein the manipulator is made in the form of a carriage moving along guides installed within the transfer chamber which has a rod for seizing the cartridge moving along it by means of a drive.

* * * * *